United States Patent [19]
Yang

[11] Patent Number: 5,771,196
[45] Date of Patent: Jun. 23, 1998

[54] SENSE AMPLIFIER CIRCUITRY

[75] Inventor: Nien-Chao Yang, Hsinchu, Taiwan

[73] Assignee: Macronix International Co, Ltd., Hsinchu, Taiwan

[21] Appl. No.: 751,823

[22] Filed: Nov. 19, 1996

[51] Int. Cl.$^6$ ..................................... G11G 7/02
[52] U.S. Cl. ............... 365/207; 365/189.06; 365/189.11
[58] Field of Search .................... 365/207, 208, 365/206, 196, 189.06, 189.11, 227, 203

[56] References Cited

U.S. PATENT DOCUMENTS

| | | | |
|---|---|---|---|
| 4,932,002 | 6/1990 | Houston | 365/207 |
| 5,526,314 | 6/1996 | Kumar | 365/207 |
| 5,646,887 | 7/1997 | Truong et al. | 365/207 |

*Primary Examiner*—Tan T. Nguyen
*Attorney, Agent, or Firm*—Mark A. Haynes; Wilson, Sonsini, Goodrich & Rosati

[57] ABSTRACT

The sense amplifier of the present invention contains a circuit that can pre-charge its output to a default state (e.g., the "0" state) during one time period and sets the output to a second state in another time period only if there is a need to do so. In this sense amplifier, cell leakage (and not cell current) is used as reference. Further, only the second state needs to be developed. As a result, the sensing margin increases. One characteristics of the present sense amplifier is that different parts of the circuit is active during different time period. As a result, both noise and power consumption is reduced. The sense amplifier is coupled to a timing circuit that can provide appropriate timing signals to operate the sense amplifier. In addition, a power-on reset circuit is disclosed. This reset circuit is operative when power is first applied to the system. It causes the timing circuit to generates a timing signal so that valid data can be detected by the sense amplifier when power is turned on.

15 Claims, 9 Drawing Sheets

SENSE AMPLIFIER CIRCUITRY

FIELD OF THE INVENTION

The present invention related to integrated-circuit memory arrays, and in particular, to sensing of currents during reading of such memory arrays to determine whether or not a particular memory cell is programmed with a "1" or a "0."

BACKGROUND OF THE INVENTION

Sense amplifiers are typically used to read the state ("0" or "1") of memory cells in memory arrays, such as read-only memory (ROM) arrays. A ROM array may contain millions of memory cells arranged in rows and columns. The sources of each cell in a column may be connected to a source-column line, and the source-column line for a selected cell may be connected to a reference potential or ground during reading of the selected cell by a sense amplifier. The drains of each cell in a column are connected to a separate bit-line (drain-column line), and the drain-column line for a selected cell is connected to the input of the sense amplifier during reading of the selected cell. The control gates of each cell in a row are connected to a word line, and the word line for a selected cell is connected to the predetermined select voltage during reading of the selected cell.

During the read operation, the current through the selected cell is compared with a reference current to determine whether or not the selected cell is programmed with a "0" or a "1". The reference circuitry is connected to the input of a first current-sensing amplifier. The output of the first current-sensing amplifier is connected to one side of a differential amplifier. The differential amplifier compares the voltage output of the first current-sensing amplifier with the voltage output of a second sensing amplifier connected to the selected memory cell being read. If the reference-circuitry comprises a memory cell that is essentially the same as the memory cell being read, it is generally necessary to unbalance the current-sensing amplifiers in order to arrive at a reference current between the current of selected cells programmed with a "0" and the current of selected cell programmed with a "1."

Problems associated with such prior-art sensing methods include slow sensing speed, noise susceptibility, and large silicon area. Prior art sense amplifiers try to read out "1" and "0" of the cell current at the same time. Thus, the maximum sensing margin is only one half of the full swing. As a result, there is a need to expand chip layout area and power consumption to compensate for this problem. For example, the differential amplifier in conventional sense amplifiers are large and complex. In some designs, the output driver is deliberately slowed down in order to improve noise immunity. Thus, there is a need to develop a sense amplifier that increases sensing speed, decreases noise susceptibility and reduces chip layout area.

SUMMARY OF THE INVENTION

The sense amplifier of the present invention contains a circuit that can pre-charge the output to a default state (e.g., the "0" state) and sets the output to a second state only if there is a need to do so. In this sense amplifier, cell leakage (and not cell current) is used as reference. Further, only the second state needs to be developed. One advantage of this arrangement is that the sensing margin increases.

The sense amplifier of the present invention also separates the sensing operation into different cycles. One of the cycles is a pre-charge cycle for pre-charging the output. Another cycle is the sense cycle which develops the data. The output of the sense cycle is latched. The data is made available in a different cycle. One benefit of this arrangement is that noise is reduced.

In one embodiment of the present invention, the sense amplifier contains a presense circuit that comprises a pass transistor having a first conduction terminal (e.g., the source) connected to a bit-line and a second conduction terminal (e.g., the drain) providing an output voltage (for indicating the state of the memory cell). The second conduction terminal is connected to a reference transistor that provides a weak pull-up. The second conduction terminal is also connected to a second transistor that provides a strong pull-up. This second transistor is turned on (by using a timing signal) after the pass transistor has reached the first state. If the state of the memory cell is such that the output voltage of the pass transistor should be at the first state, the second transistor would not substantially affect the output voltage. If the state of the memory cell is such that the output voltage of the pass transistor should be at the second state, the second transistor would change the output voltage of the pass transistor. As a result, the state of the memory cell can be detected.

In this embodiment of the sense amplifier, a latch circuit is provided. This latch circuit latches the output voltage of the pass transistor. As a result, the state of the memory cell can be read even after the sensing operation in the pre-sense circuit is terminated. An output driver (connected to the latch circuit) can be turned on so as to deliver the sensed data to a requesting circuit element.

Because the operation of the present sense amplifier can be separated into distinct cycles, different parts of the circuit can be turned on using a number of timing signals. As a result, only portions of the circuit are active at a given time. Consequently, noise can be reduced.

Circuits that can be used to generate the timing signals are also disclosed. In one embodiment of these circuits, they use delay chains, word-line delays, bit-line pull-up delays and cell currents to generate various timing sequences. An advantage of this design is that the present sense amplifier works well with temperature, process and power supply level variations.

A power-on reset circuits that can ensure correct data are sensed during a power turn on is also disclosed. The circuit contains means for initially tracking the supply voltage after power is turned on. The reset circuit also contains means for setting the output voltage to a low level when the output voltage of the power-on reset circuit rises to a predetermined value. At this point in time, selected ones of the above-mentioned timing signals are generated so as to sense the data in memory array.

These and other features of the present invention will become apparent from the following description when read in conjunction with the accompanying drawings.

DETAILED DESCRIPTION OF THE INVENTION

The present invention comprises a novel sense amplifier design. The following description is presented to enable any person skilled in the art to make and use the invention. Descriptions of specific applications are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1A:
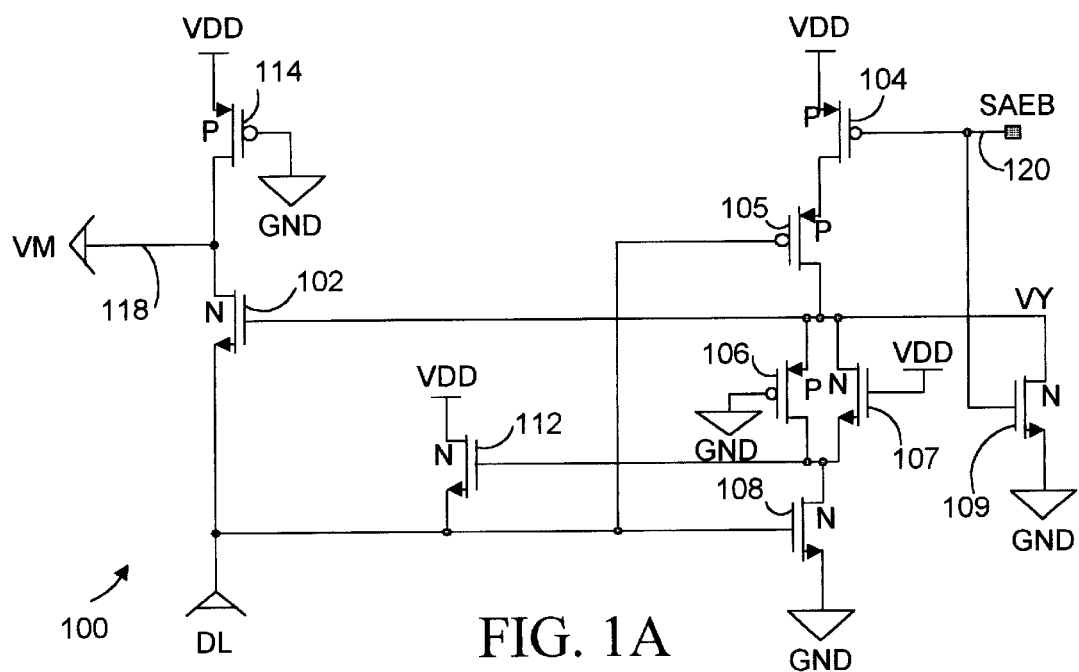
FIGS. 1A–1C are drawings showing components of a prior art sense amplifier.
Figure 1B:
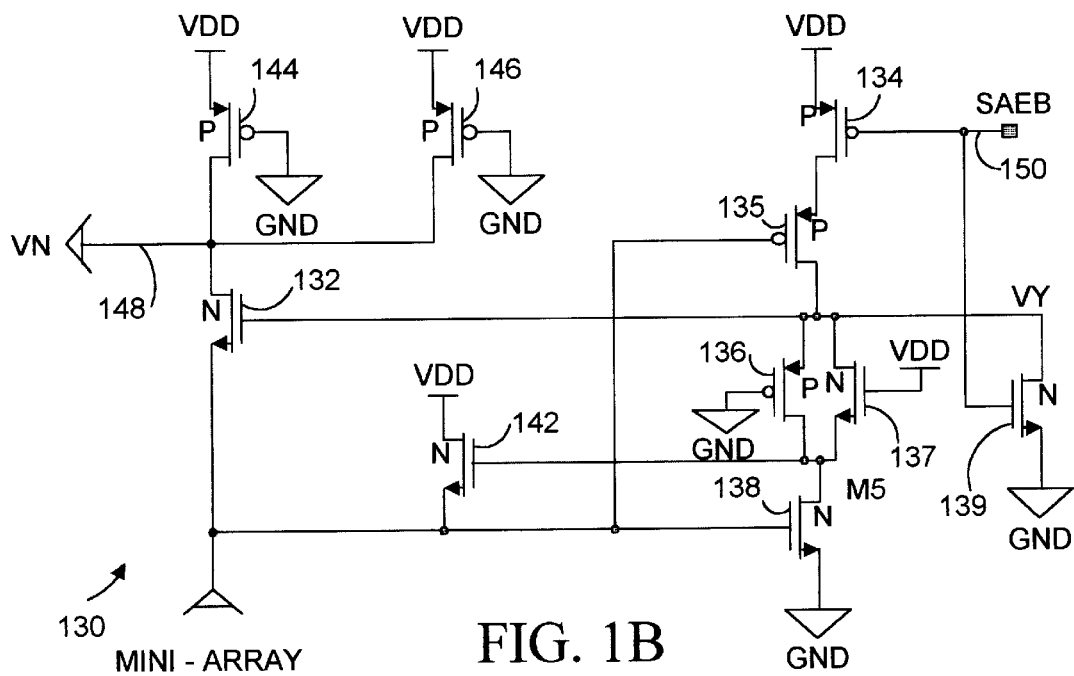
Figure 1C:
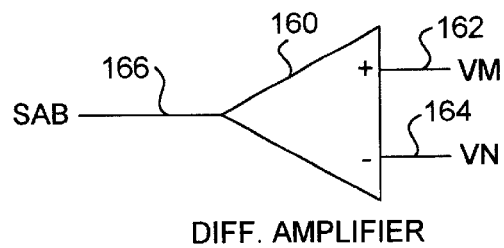

In order to understand the distinction between the present invention and the prior art, a typical prior art current sense amplifier ("senamp") is first described. It consists of three main parts: (i) a pre-sense circuit 100 (shown in FIG. 1A), (ii) a reference sense circuit 130 (shown in FIG. 1B), and a differential amplifier 160 (shown in FIG. 1C). Presense circuit 100 comprises of a pass transistor 102 having a source connected to a bit-line ("DL"). The gate of transistor 102 is biased by a voltage generated by transistors 104–109. This bias voltage generation circuit is turned on by a sense amplifier enable signals applied to a line 120. A transistor 112 having a source connected to bit-line DL is used to provide a strong pull-up to the bit-line. A weak pull-up transistor 114 connects the drain of pass transistor 102 to a supply voltage $V_{DD}$. After pass transistor 102 is turned on, transistor 114 converts memory cell current (obtained from bit-line DL) to a voltage level $V_M$ appearing on a line 118 connected to the drain of pass transistor 102. When the data at the cell is at a "1" state, the current flowing through transistor 102 is larger than that through transistor 114. Consequently, the voltage level of $V_M$ becomes low. In a similar manner, the voltage level of $V_M$ becomes high when the data at the cell is at a "0" state.

Reference sense circuit 130 comprises of a pass transistor 132 having a source connected to a mini-array (not shown). The gate of transistor 132 is biased by a voltage generated by transistors 134–139. This bias voltage generation circuit is turned on by a sense amplifier enable signals applied to a line 150. A transistor having a source connected to the mini-array is used to provide pull-up. Two parallel transistors, 144 and 146, connect the drain of transistor 132 to supply voltage $V_{DD}$. The voltage $V_N$ of the drain of transistor 132 (appearing on a line 148) is the output voltage of reference sense circuit 130. Transistors' 144 and 146 make the sensing ratio 1:2 so that voltage $V_N$ stays between the two voltage levels of $V_M$ that correspond to the above described "1" and "0" cell states.

Lines 118 and 148 are connected to two input terminals 162 and 164, respectively, of differential amplifier 160. The output terminal 166 of differential amplifier 160 (which is the output of the prior art senamp) is at a high level (i.e., close to the supply voltage) or a low level (i.e., close to ground) depending on the relative values of $V_M$ and $V_N$.

This prior art senamp has several problems: its sensing margin is low and its silicon area is large. When it is applied to high speed page mode ROM, the largest sensing margin is only half of the voltage difference between the bit-line level and the supply voltage $V_{DD}$. For example, for a 3-volt ROM, the voltage of $V_N$ is 2.0 volts while the voltage level of $V_M$ is 2.2 volts for a "0" state and 1.8 volts for a "1" state. Consequently, it is difficult to distinguish between the "0" and "1" states. Further, the large silicon area makes it hard to fit the senamp in the bit-line pitches of the page mode ROM.

Figure 2A:
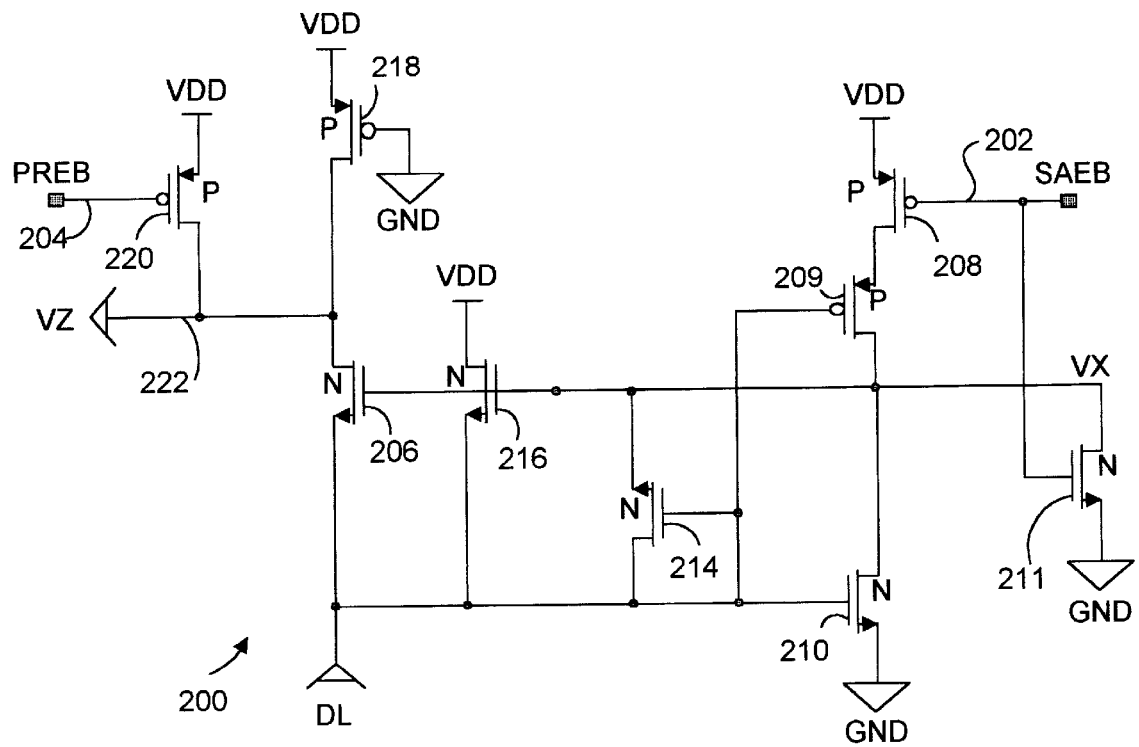
FIGS. 2A–2B are drawings showing components of a sense amplifier of the present invention.
Figure 2B:
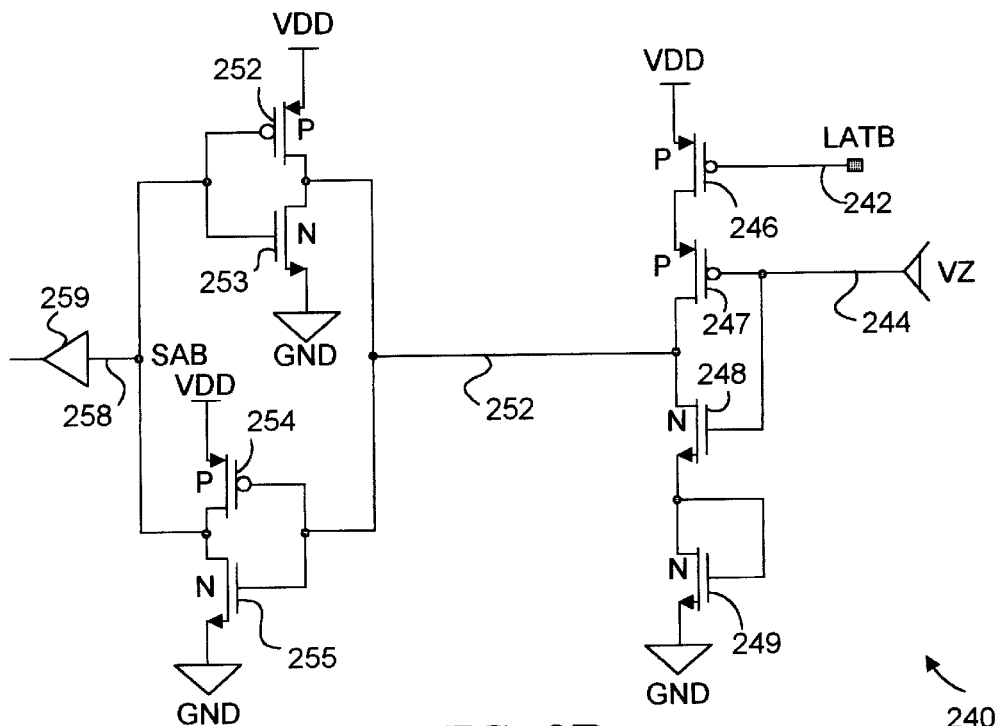

A senamp of the present invention is shown in FIGS. 2A–2B. This circuit contains only seventeen transistors (versus nineteen transistors and a differential amplifier for the prior art senamp shown in FIGS. 1A–1C). It can be easily fit into the bit-line pitches of high speed page mode ROMs. Further, the sense margin is high.

The senamp of the present invention contains a pre-sense circuit 200 (shown in FIG. 2A) and a latch circuit 240 (shown in FIG. 2B). These two circuits are controlled by three timing signals: a senamp enables signal (labeled as "SAEB"), a pre-charge signal (labeled as "PREB"), and a latch signal (labeled as "LATB"). These signals are applied to lines 202, 204, and 242, respectively. The timing diagram of these signals and circuits for generating the same will be described later. These timing signals are generated in response to address and chip enable signals applied to a ROM chip incorporating the senamp of the present invention.

Pre-sense circuit 200 comprises a pass transistor 206 having its source connected to a bit-line (labeled as "DL"). Transistors 208–211 provide a bias voltage which is applied to the gate of transistor 206. A transistor 214 has its drain connected to the bit-line DL and its source connected to the gate of transistor 206. It provides a leak-down path when line DL is at an abnormally high level. The presence of this transistor improves data line stability and high speed sensing. A transistor 216 has its drain connected to $V_{DD}$ and its source connected to the bit-line DL. It provides a pull-up path when the bit-line is at an abnormally low level. The size of transistor 216 is designed to be much smaller than transistor 206 so that most cell current flows through pass transistor 206. Two transistors, 218 and 220, connect $V_{DD}$ to the drain of pass transistor 206. Transistor 218 provides a weak pull-up and functions as a cell leakage current filter. Transistor 220 provides a strong pull-up, and is controlled by the signal PREB. The voltage of the drain of pass transistor 206 is the output voltage (Vz) of pre-sense circuit 200. It is applied to latch circuit 240 through a line 222. The output signal at line 222 is connected to a line 244 of latch circuit 240. A latch circuit contains an inverter portion comprising of transistors 246–249 and a latch portion comprising of transistors 252–255. The voltage Vz is connected to the gates of transistors 247 and 248 in the inverter portion. The role of transistor 249 is to shift the trip point of this inverter to meet the swing range of Vz. The inverter is turned on by the timing signal LATB applied to a line 242. The output of the inverter (on a line 252) is coupled to the drain of transistors 252, 253 and the gate of transistor 254, 255 in the latch portion. The output of this senamp of the present invention is the signal SAB on a line 258. This signal is connected to a data driver 259 for providing enhanced ability to deliver the data to other circuit elements. This data driver is preferably turned on only when data is ready on line 258.

An advantageous feature of the present invention is that the voltage swing of the Vz signal can range from the bit-line voltage (about 1.2 to 1.3 volt) to $V_{DD}$ (about 3 volts). This would provide enough sensing margins for the latch circuit 240, even under the condition of cell leakage induced by process deviation.

In the prior art, conventional senamps try to read out "1" and "0" of the cell current at the same time using the mini-array as reference. Thus, the maximum sensing margin is only one half of the full swing. As a result, there is a need to expand chip layout area and power consumption to compensate for this problem. For example, conventional senamps contain a complicated differential amplifier. In some design, the output driver is deliberately slowed down in order to improve noise immunity.

In the present invention, there is no need to use a mini-array. Instead, the cell leakage current through transistor 218 is used as a reference. As explained further below in connection with the timing signals SAEB, PREB and LATB, a pre-charge period is used to set the default data to a "0" state before the word-line is ready. Thus, only the "1" state needs to be sensed using the cell leakage as reference in the sensing period. As a result, the sensing margin increases tremendously. An additional difference between the senamp of the present invention and the prior art is that (i) data is latched before the output driver is turned on and (ii) the output driver is turned off during the sense period. As a result, there is no need to impose a trade off between output speed and noise.

Figure 3:
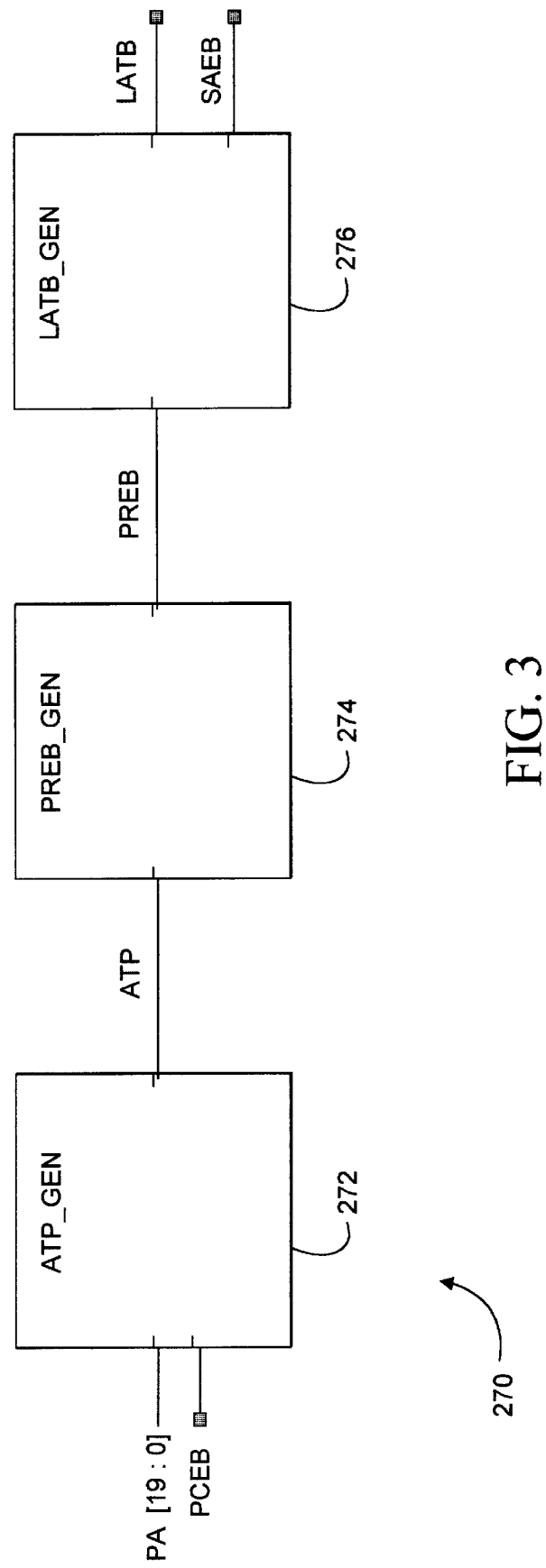
FIG. 3 is a block diagram showing a clock signal generation circuit of the present invention.

It can be seen from the above that correct timing is important for the present invention. FIG. 3 is a block diagram of a generator 270 that can be used to generate the timing signals of the present invention. Generator 270 comprises a block 272 that generates a first timing signal (called address transition pulse "ATP") in response to a chip enable (PCEB) signal and transition in address signals (PA[19:0]). A circuit diagram for block 272 and the timing of the ATP signal will be provided below. The ATP signal is coupled to another block 274 that generates the above-mentioned PREB signal. A circuit diagram for block 274 and the timing of the PREB signal will be provided below. The PREB signal is coupled to a block 276 that generates the above-mentioned LATB and SAEB signals. A circuit diagram for block 276 and the timing of signals LATB and SAEB will be provided below.

Figure 4:
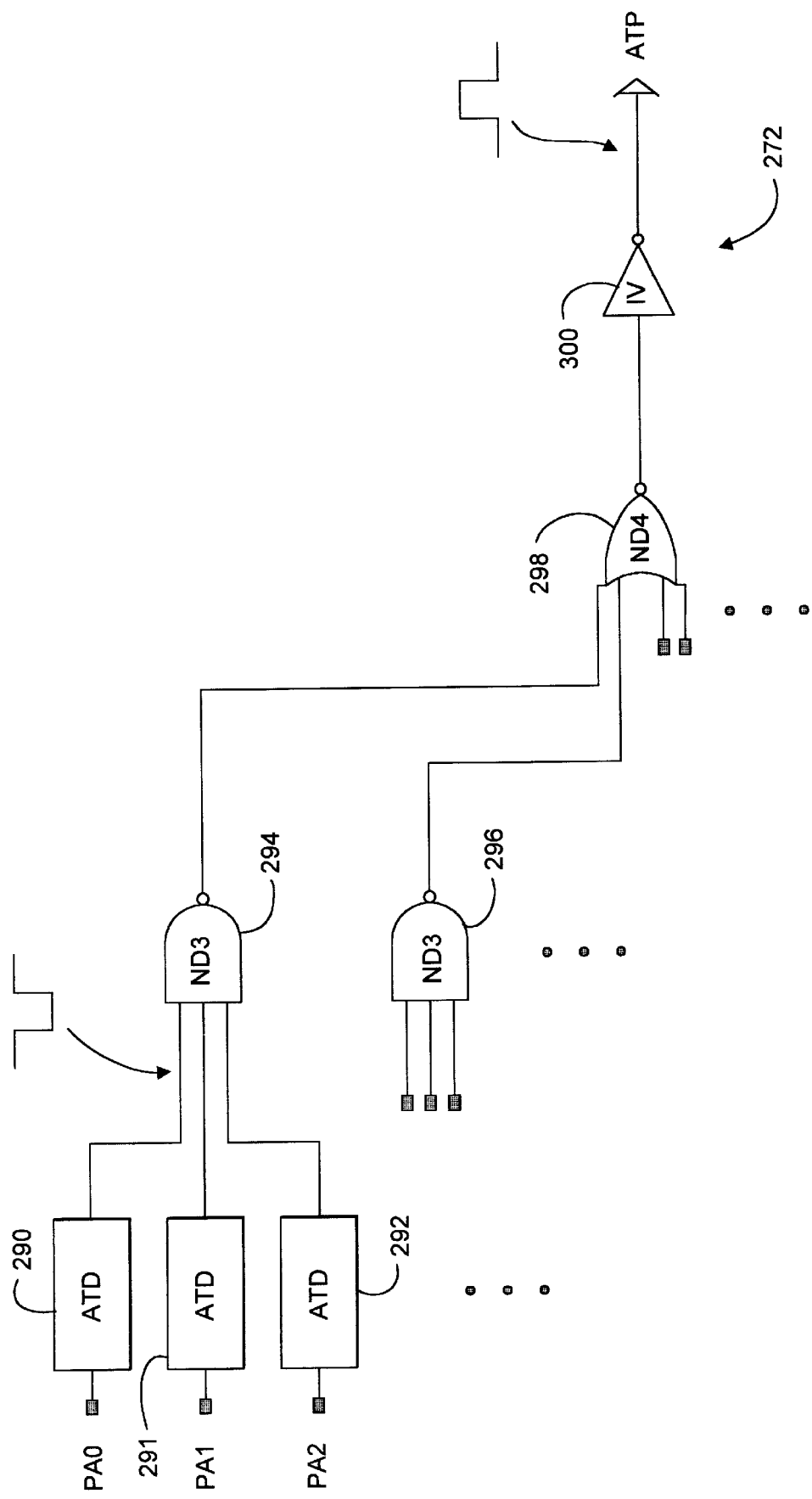
FIG. 4 is a schematic diagram of a circuit that can be used to generate the address transition pulse signal of the present invention.

FIG. 4 is a schematic diagram of block 272 that generates the ATP signal. It comprises a plurality of address transition detectors (ATDs), such as ATDs 290–292, one for each address signal (e.g., PA0, PA, PA2, . . . ). A number of NAND gates, such as gates 294 and 296, are used to form the "NAND" of all the signals out of the ATDs. The output of the NAND gates are coupled to a NOR gate 298. The output of NOR gate 298 is coupled to an inverter 300, which generates the output voltage ATP. It can be seen that the width of the ATP signal is determined by logic gate delays. Block 272 also contains a circuit (not shown) that activates the generation of the ATP signal in response to the chip enable signal PCEB.

Figure 5:
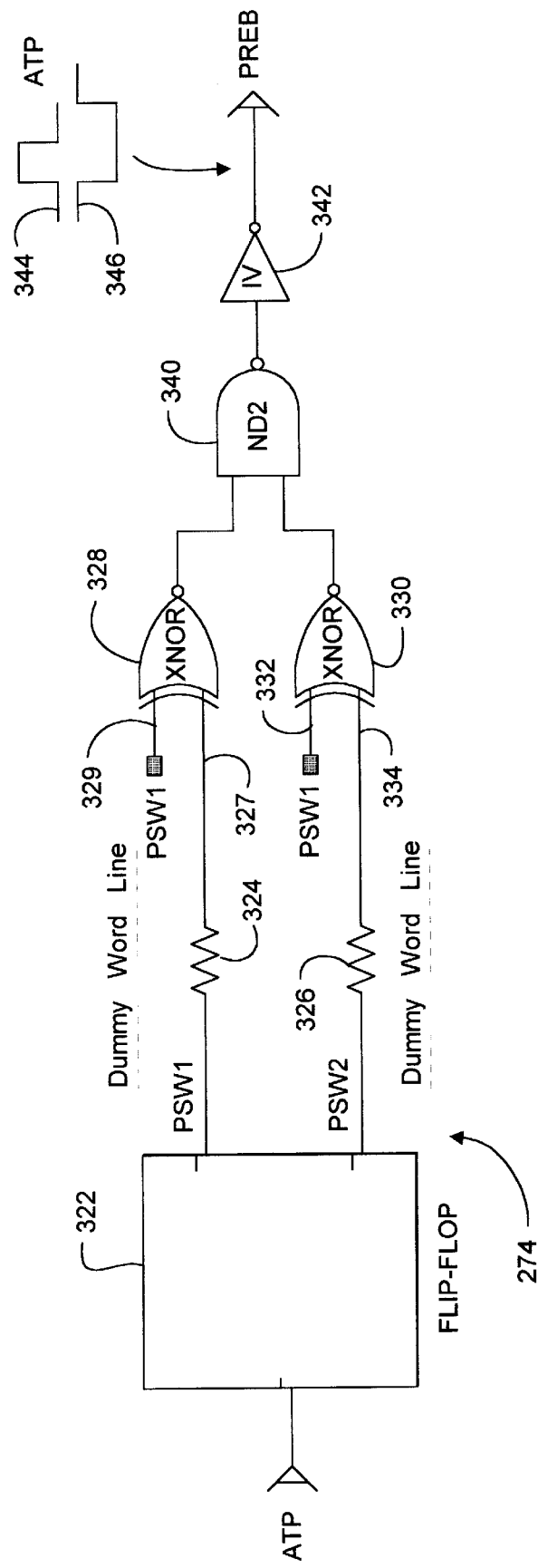
FIG. 5 is a schematic diagram of a circuit that can be used to generate the presense enable signals of the present invention.

FIG. 5 is a schematic diagram of block 274 that generates the PREB signal. Block 274 contains a flip flop 322 that accepts the ATP signal and generates two preselected word-line signals ("PSW") that are complementary to each other:

PSW1 and PSW2. These two signals are coupled to separate dummy word lines 324 and 326. Dummy word line 324 is coupled to one terminal 327 of a XNOR gate 328. The other terminal 329 of XNOR gate 328 is coupled to PSW1. Dummy word line 326 is coupled to one terminal 334 of XNOR gate 330. The other terminal 332 of XNOR gate 330 is coupled to PSW1. The output of XNOR gates 328 and 330 are coupled to a NAND gate 340. The PREB signal is generated by coupling the output of NAND gate 340 to an inverter 342.

The PREB signal generated by this circuit is the slower of the word-line delay from high to low or low too high. The pre-charge signal (PREB) should be the slower one of wordline delay and the bit-line pull-up delay. For the case of a flat ROM, the word-line delay is much longer than the bit-line pull-up. Thus, the wordline delay normally controls the PREB signal.

In order to illustrate the relationship between the ATP and PREB signals, FIG. 5 shows the shape and width of the ATP signal (shown as reference 344) and that of the PREB signal (shown as reference 346).

Figure 6:
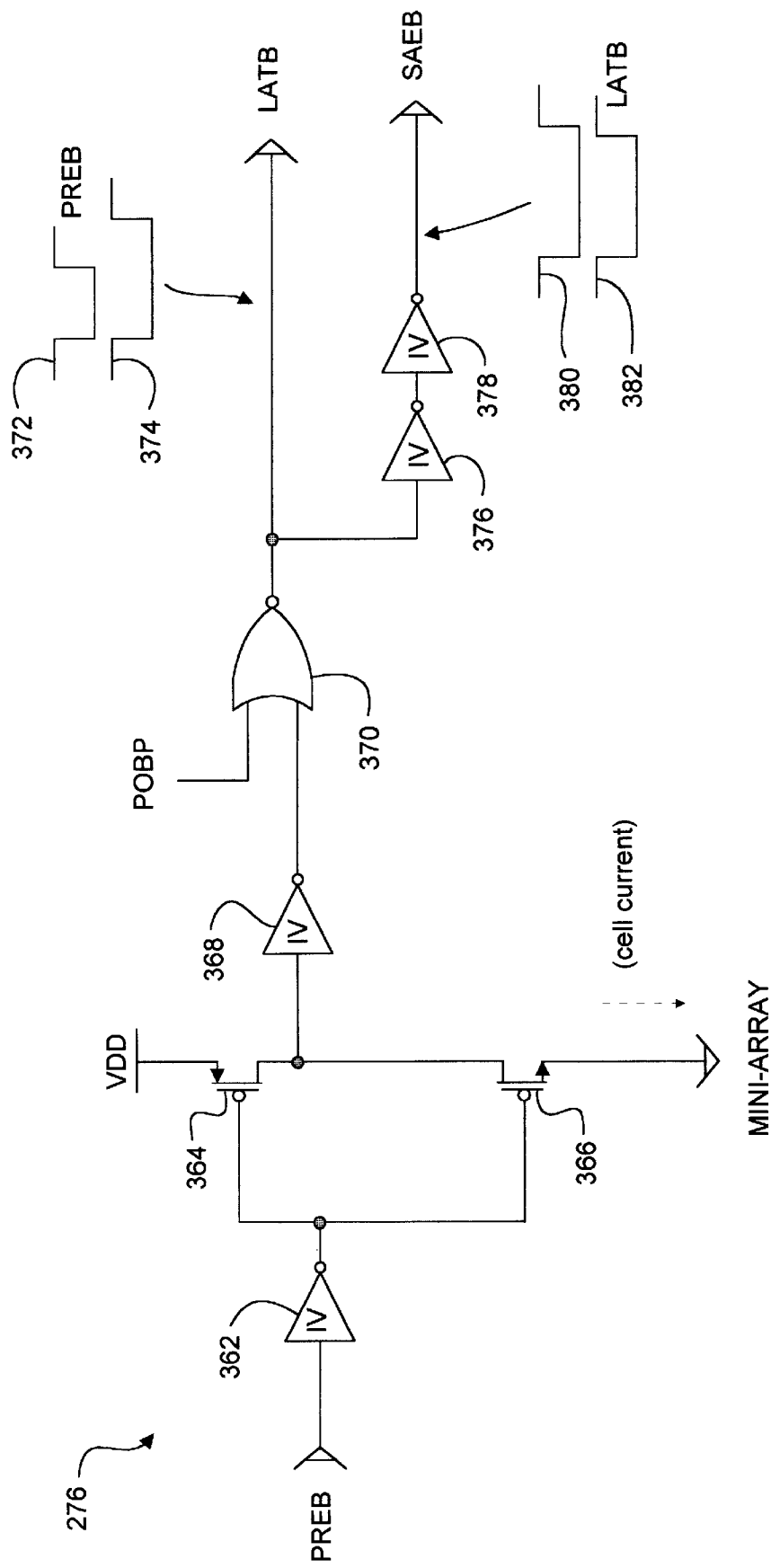
FIG. 6 is a schematic diagram of a circuit that can be used to generate the latch and a sense amplifier enables signals of the present invention.

FIG. 6 is a schematic diagram of block 276 that generates the LATB and SAEB signals. Block 276 contains an inverter 362 that accepts the PREB signal and couples it (after inversion) to the gate terminals of two transistors 364 and 366. The source terminal of transistor 364 is coupled to $V_{DD}$ while the source terminal of transistor 366 is coupled to a mini-array for cell current simulation. Note that this mini-array is not used in the semamp itself, but is used in clock generation. The drain terminals of transistors 364 and 366 are coupled together and connected to an inverters 368 and a serially connected NOR gate 370. The second input of NOR gate 370 is connected to a power-on signal (POBP) which is explained below. The resulting signal is the LATB signal.

In order to illustrate the relationship between the PREB and LATB signals, FIG. 6 shows the shape and width of the PREB signal (shown as reference 372) and that of the LATB signal (shown as reference 374).

Two inverters 376 and 378 are coupled to the output of inverter 370. The output of inverter 378 generates the SAEB signal. In order to illustrate the relationship between the SAEB and LATB signals, FIG. 6 shows the shape and width of the SAEB signal (shown as reference 380) and that of the LATB signal (shown as reference 382). Signal 382 is, of course, the same as signal 374. The slight increase in the pulse width of the SAEB signal is due to the delays introduced by inverters 376 and 378.

One aspect of the circuit in FIG. 6 is that the delay introduced in generating the LATB and SAEB signals is proportional to the cell current which passes through transistors 364 and 366.

It can be seen from the circuits in FIGS. 4–6 that the signals are generated using logic gate delay, wordline delay and cell current. As a result, variations in process, temperature and power supply level do not play a major effect in the senamp of the present invention.

Figure 7:
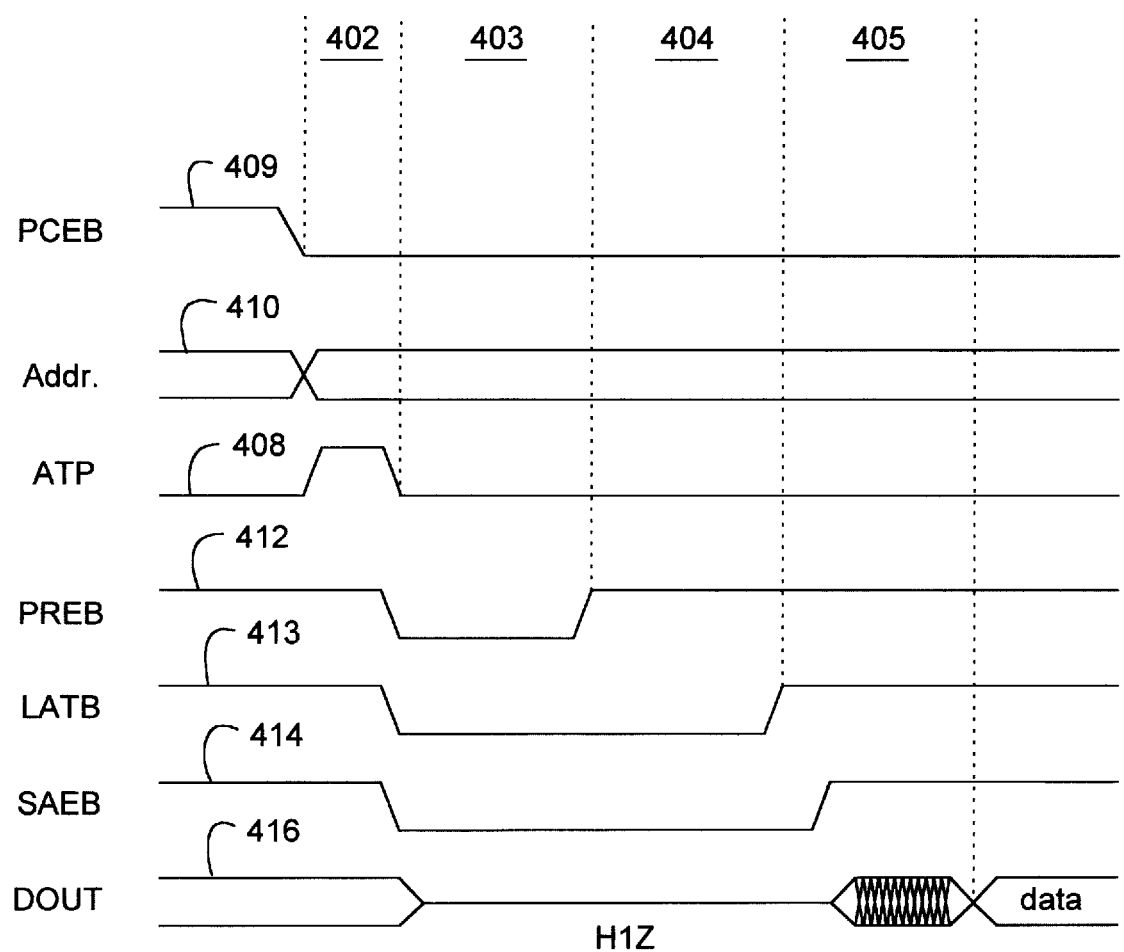
FIG. 7 is a drawing showing timing diagrams of various timing signals used in the sense amplifier of the present invention.

FIG. 7 is a timing diagram 400 that shows the relative timing between the above described signals. There are four different time periods, shown in FIG. 7 as reference numerals 402–405. In period 402 (the first period), the ATP signal 408 is generated in respond to the PCEB 409 and address signals 410. As pointed out above, all other timing signals are generated in response to this ATP signal. In period 403 (the second period), the PREB (412), LATB (413) and SAEB (414) signals are generated. The width of both the LATB and SAEB signals are longer than the width of PREB signals because of the circuit delay. During this time period, the voltage level of Vz is pulled up to $V_{DD}$. Thus, this period can be considered a "precharge" period. In period 404 (the third period), the PREB signal goes high. At this point, the voltage level of Vz is allowed to develop. The voltage level will remain at $V_{DD}$ if the data is "0" while the voltage level will fall to a predetermined level if the data is "1." Thus, this period could be considered a "sensing period." In period 405 (the fourth period), both the SAEB and LATB signals go high. The data is latched by circuit 240. The SAEB signal goes high several nanoseconds after LATB to make sure that correct data is latched. At this time, the senamp is turned off so that power can be reduced. The output driver can now be turned on because the correct data is latched. This is illustrated in FIG. 7 by the present of valid data after period 405 on a data output bus (see bus 416).

There is one refinement to the above described circuit. Just after the power to the senamp circuit of the present invention is turned on, the latched data may not have the correct value. A special zero standby current power-on reset circuit 430 (shown in FIG. 8) is designed to make sure that the first latched data has the correct value. Circuit 430 comprises a plurality of transistors (432–437) connected to a node 450. Node 450 is also connected to a capacitor 452 and the input terminal of an inverter 454. The output of inverter 454 is connected to a node 456. The gate of transistor 436, a capacitor 458, and the input terminal of an inverter 460 are also connected to node 456. Capacitor 458 is also connected to the supply voltage $V_{DD}$. The output terminal of inverter 460 is connected to a node 462. Node 462 is also connected to a capacitor 464, a transistor 466 and the input terminal of an inverter 468. The power on a signal (POB) is delivered at the output terminal of inverter 468. This signal is fed to a delay chain 470 and an input terminal of NOR gate 472. The output of delay chain 470 is coupled to an inverter 471, which is in term coupled to the other input terminal of NOR gate 472. The output of NOR gate 472 is a modified power on signal POBP. This signal is coupled to NOR gate 370 of FIG. 6.

When the $V_{DD}$ power is turned on from ground level, the voltage at node 456 tracks $V_{DD}$ and turns on transistor 436 and 435. When the level of $V_{DD}$ starts to reach $2V_{TN}+V_{TP}$, the voltage at node 456 begins to go low, thereby turning off the current path of transistor 436. In the above formula, $V_{TN}$ and $V_{TP}$ are the threshold voltage of all NOMOS and POMS transistors, respectively. As a result, transistor 437 can pull node 450 to the $V_{DD}$ level. At this time, the voltage at the output of inverter 468 (i.e., the POB signal) will go low. This is illustrated as line 482 in FIG. 9. The POBP signal rises to $V_{DD}$ at this time. It will remain at this voltage level for a period of time related to delay chain 470. This is illustrated as line 483 in FIG. 9.

Figure 9:
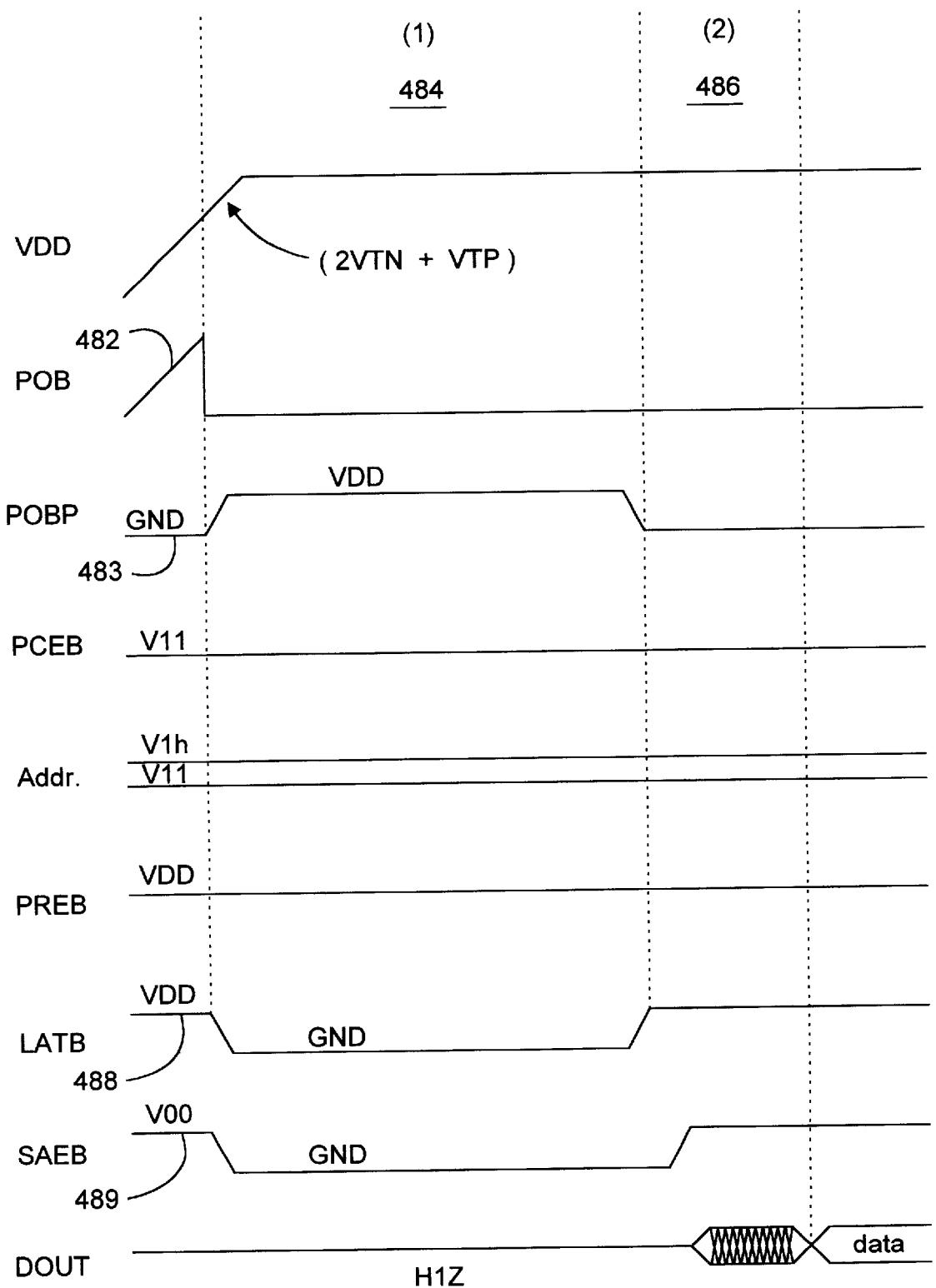
FIG. 9 is a drawing showing timing diagrams of various timing signals related to the power-on reset circuit of the present invention.

FIG. 9 can be divided into two main periods 484 and 486. During period 484, a microsecond or millisecond range delay circuits (which could be generated by a conventional delay chain) is enabled to make the LATB and SAEB signals low (shown in FIG. 9 as signals 488 and 489, respectively) for a period of time for circuit 200 to sense the real data in memory cells. After period 484, these two signals go high again. The output driver (not shown) is turned on and the senamp circuit 200 and 240 are turned off. The correct data is delivered.

Figure 8:
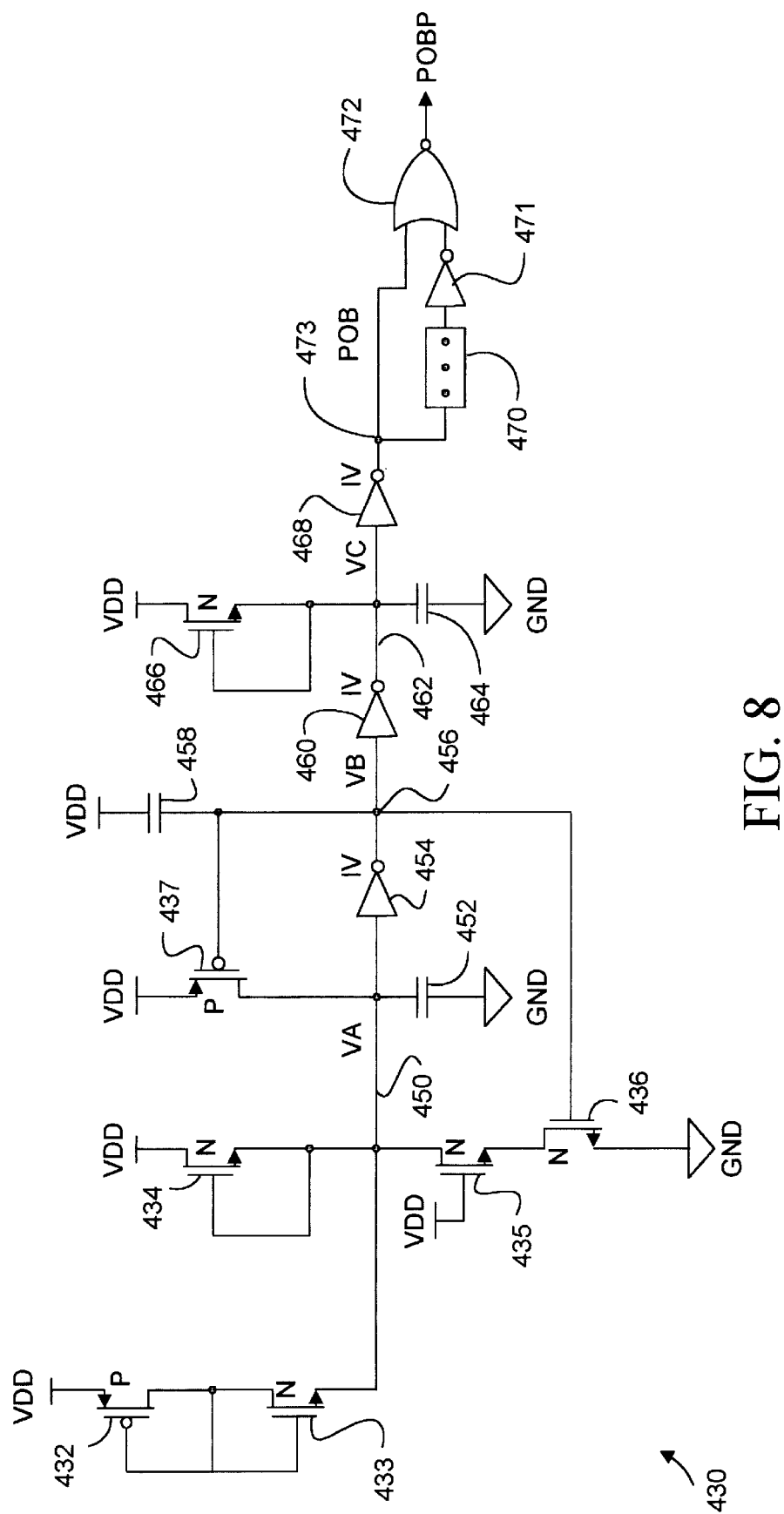
FIG. 8 is a schematic diagram of a power-on reset circuit of the present invention.

In the power-on reset circuit 430 of FIG. 8, inverter 454 is preferably an unbalanced inverter with its NMOS part much larger than the PMOS part. Capacitors' 452, 458 and 464 are preferably large capacitors made by gate oxide. These capacitors are used to couple the nodes 450, 456, and 462 to ground or $V_{DD}$, as the case may be. Transistor 435 is preferably a weak transistor. Transistor 434 is preferably sufficient to clamp the voltage of node 450 when the supply voltage is powered down.

The invention has been described with reference to specific exemplary embodiments thereof. Various modification and changes may be made thereunto without departing from the broad spirit and scope of the invention. The specification and drawings are, accordingly, to be regarded in an illustrative rather than a restrictive sense; the invention is limited only by the provided claims.

What is claimed is:

1. A sense amplifier having an input connected to a bit line of a memory array, comprising:
   a first circuit that sets its output to a first value at a first time period; and
   a second circuit coupled to said first circuit for setting said output to a second value at a second time period in response to a state in said bit line.

2. The sense amplifier of claim 1 wherein said first circuit further comprises:
   a first transistor having a first conduction terminal connected to a voltage source and a second conduction terminal;
   a pass transistor having a first conduction terminal connected to said second conduction terminal of said first transistor and a second conduction terminal coupled to said bit line, said first conduction terminal of said pass transistor supplying said output; and
   a third circuit coupled to a gate terminal of said pass transistor for generating a bias voltage to said pass transistor.

3. The sense amplifier of claim 2 wherein said second circuit comprises a second transistor having a first conduction terminal connected to said voltage source and a second conduction terminal connected to said first conduction terminal of said pass transistor, said second transistor having a gate terminal connected to a timing signal that turns off said second transistor in said second time period.

4. The sense amplifier of claim 2 wherein said first and second circuits comprise elements of a single integrated circuit having a pin that receives an external signal further comprising a circuit that disables said sense amplifier in response to said external signal.

5. The sense amplifier of claim 4 wherein said circuit that disables said sense amplifier comprises a circuit that will turn off said pass transistor.

6. The sense amplifier of claim 1 further comprising a latch for generating a latched output in response to said output.

7. The sense amplifier of claim 6 further comprising a data driver for delivering said latched output, said data driver being turned on after said second time period.

8. The sense amplifier of claim 1 further comprising a clock generating circuit for generating a first timing signal having a width related to said first time period and a second timing signal having a width related to said second time period.

9. The sense amplifier of claim 8, wherein said clock generating circuit comprises:
   means responsive to address transition in said memory array for generating a pulse;
   means responsive to said pulse for generating said first timing signal; and
   means responsive to said first timing signal for generating said second timing signal.

10. The sense amplifier of claim 9 wherein said means for generating a pulse comprises a plurality of address transition detectors connected to a plurality of logic gates.

11. The sense amplifier of claim 9 wherein said means for generating said first timing signal comprises:

a flip flop responsive to said pulse for generating a pair of complementary pulse signals;

a pair of dummy word lines connected to said pair of complementary pulse signals; and a plurality of logic gates connected to said pair of dummy word lines and said pair of complementary pulse signals to generate said first timing signal, said first timing signal having a width longer than said pulse.

12. The sense amplifier of claim 9 wherein said means for generating said second timing signal comprises:

a mini array;

a PMOS transistor having a source connected to a voltage source, a drain, and a gate connected to a signal representative of said first timing signal;

a NMOS transistor having a source connected to said mini array, a drain connected to said drain of said PMOS transistor, and a gate connected to a signal representative of said first timing signal; and a plurality of gates connected to said drains to generate said second timing signal.

13. The sense amplifier of claim 8 further comprising a power-on reset circuit for generating a power-on signal in response to initial voltage being applied to said sense amplifier, said power-on signal being used by said clock generating circuit to generate said second timing signals for determining a valid data for a short time after power-on.

14. The sense amplifier of claim 13, wherein said power-on reset circuit comprises:

a circuit that generates a first signal when said initial voltage rises above a predetermined value; and a circuit that generates said power-on signal in response to said first signal.

15. The sense amplifier of claim 14, wherein the circuit that generates said power-on signal comprises a delay chain that generates a pulse in response to said first signal.

* * * * *